(12) United States Patent
Park et al.

(10) Patent No.: US 9,490,228 B2
(45) Date of Patent: Nov. 8, 2016

(54) ANISOTROPIC CONDUCTIVE FILM INCLUDING CONDUCTIVE ADHESIVE LAYER AND SEMICONDUCTOR DEVICE CONNECTED BY THE SAME

(71) Applicants: Kyoung Soo Park, Uiwang-si (KR); Soon Young Kwon, Uiwang-si (KR); Ji Yeon Kim, Uiwang-si (KR); Young Woo Park, Uiwang-si (KR); Jae Sun Han, Uiwang-si (KR); Ja Young Hwang, Uiwang-si (KR)

(72) Inventors: Kyoung Soo Park, Uiwang-si (KR); Soon Young Kwon, Uiwang-si (KR); Ji Yeon Kim, Uiwang-si (KR); Young Woo Park, Uiwang-si (KR); Jae Sun Han, Uiwang-si (KR); Ja Young Hwang, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 78 days.

(21) Appl. No.: 14/229,003

(22) Filed: Mar. 28, 2014

(65) Prior Publication Data
US 2014/0291869 A1    Oct. 2, 2014

(30) Foreign Application Priority Data
Mar. 29, 2013  (KR) .......................... 10-2013-0034163

(51) Int. Cl.
*H01L 23/00*    (2006.01)
*C09J 9/02*    (2006.01)
(Continued)

(52) U.S. Cl.
CPC .................. *H01L 24/29* (2013.01); *C09J 7/00* (2013.01); *C09J 9/02* (2013.01); *C09J 11/00* (2013.01); *H01L 24/13* (2013.01); *H01L 24/27* (2013.01); *H01L 24/81* (2013.01); *H01L 24/83* (2013.01); *H05K 3/323* (2013.01); *C08K 7/16* (2013.01);
(Continued)

(58) Field of Classification Search
CPC ... H01L 24/26; H01L 24/32; H01L 2924/00; H01L 2914/078; H01L 2224/86951; H01L 2224/8688; H01L 2224/81901; H01L 24/83; H01L 2224/29082; H01L 2224/2919; H01L 2224/29393; H01L 24/29; H01L 2021/60277; H01L 2224/29083; C09J 9/02; C09J 2201/134; C09J 2203/326; C09J 133/04; C09J 7/00; C09J 4/00; C09J 2201/602
See application file for complete search history.

(56) References Cited

U.S. PATENT DOCUMENTS 5,586,892 A  * 12/1996  Sato ................................ 439/91
6,878,435 B2 *  4/2005  Paik ........................ B32B 27/38
                                                                257/E21.514

(Continued)

FOREIGN PATENT DOCUMENTS

JP        2011-150975 A    8/2011
KR    10-2012-0076182 A    7/2012

(Continued)

OTHER PUBLICATIONS

Office Action dated Oct. 20, 2015 in corresponding Taiwanese Patent Application No. 103111767.

*Primary Examiner* — Jasmine Clark
(74) *Attorney, Agent, or Firm* — Lee & Morse, P.C.

(57) ABSTRACT

An anisotropic conductive film includes a conductive adhesive layer including conductive particles and insulating particles, and an insulating adhesive layer not including conductive particles. In the anisotropic conductive film, the conductive particles and the insulating particles of the conductive adhesive layer have a total particle density of $7.0 \times 10^5/d^2$ to $10.0 \times 10^5/d^2$ (particles) per square millimeter ($mm^2$) (where d is a diameter of the conductive particles in μm).

17 Claims, 2 Drawing Sheets

(51) Int. Cl.
  *C09J 7/00* (2006.01)
  *C09J 11/00* (2006.01)
  *H05K 3/32* (2006.01)
  *C08K 7/16* (2006.01)
  *C08K 9/02* (2006.01)

(52) U.S. Cl.
  CPC .............. *C08K 9/02* (2013.01); *C09J 2201/36* (2013.01); *C09J 2201/602* (2013.01); *C09J 2203/326* (2013.01); *C09J 2205/102* (2013.01); *H01L 24/16* (2013.01); *H01L 24/32* (2013.01); *H01L 2224/13013* (2013.01); *H01L 2224/16225* (2013.01); *H01L 2224/271* (2013.01); *H01L 2224/27003* (2013.01); *H01L 2224/2919* (2013.01); *H01L 2224/2929* (2013.01); *H01L 2224/2939* (2013.01); *H01L 2224/29082* (2013.01); *H01L 2224/29083* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29366* (2013.01); *H01L 2224/29371* (2013.01); *H01L 2224/29387* (2013.01); *H01L 2224/29411* (2013.01); *H01L 2224/29416* (2013.01); *H01L 2224/29424* (2013.01); *H01L 2224/29439* (2013.01); *H01L 2224/29444* (2013.01); *H01L 2224/29447* (2013.01); *H01L 2224/29455* (2013.01); *H01L 2224/29464* (2013.01); *H01L 2224/29466* (2013.01); *H01L 2224/29471* (2013.01); *H01L 2224/29499* (2013.01); *H01L 2224/32225* (2013.01); *H01L 2224/81191* (2013.01); *H01L 2224/81903* (2013.01); *H01L 2224/83192* (2013.01); *H01L 2224/83203* (2013.01); *H01L 2224/83851* (2013.01); *H01L 2924/07802* (2013.01); *H01L 2924/15788* (2013.01); *Y10T 428/24959* (2015.01); *Y10T 428/25* (2015.01); *Y10T 428/28* (2015.01); *Y10T 428/2848* (2015.01)

(56) References Cited

U.S. PATENT DOCUMENTS

| | | | |
|---|---|---|---|
| 2002/0111423 A1* | 8/2002 | Paik et al. | 524/739 |
| 2006/0035036 A1* | 2/2006 | Yim et al. | 428/1.1 |
| 2010/0264539 A1* | 10/2010 | Miura | H01L 21/563 257/738 |

FOREIGN PATENT DOCUMENTS

| | | |
|---|---|---|
| KR | 10-2012-0078460 A | 7/2012 |
| TW | 201229185 A1 | 7/2012 |

* cited by examiner

ANISOTROPIC CONDUCTIVE FILM INCLUDING CONDUCTIVE ADHESIVE LAYER AND SEMICONDUCTOR DEVICE CONNECTED BY THE SAME

CROSS-REFERENCE TO RELATED APPLICATION

The present application claims priority under 35 U.S.C. §119 to Korean Patent Application No. 10-2013-0034163, filed on Mar. 29, 2013, in the Korean Intellectual Property Office, and entitled: "Anisotropic Conductive Film Including Conductive Adhesive Layer And Semiconductor Device Connected By The Same," which is incorporated by reference herein in its entirety.

BACKGROUND

1. Field

Embodiments relate to an anisotropic conductive film including a conductive adhesive layer, and a semiconductor device connected by the same.

2. Description of the Related Art

Anisotropic conductive films (ACFs) refer to film-shaped adhesives in which conductive particles are dispersed in a resin, and which exhibit electric conductivity in the z-axis and insulation properties in a direction of an x-y plane.

SUMMARY

Embodiments are directed an anisotropic conductive film including a conductive adhesive layer, which includes conductive particles and insulating particles, and an insulating adhesive layer, which does not include conductive particles. The conductive particles and the insulating particles of the conductive adhesive layer may have a total particle density of $7.0 \times 10^5/d^2$ to $10.0 \times 10^5/d^2$ (particles) per square millimeter ($mm^2$) (where d is a diameter of the conductive particles in μm).

Embodiments are also directed to an anisotropic conductive film including a conductive adhesive layer, which includes conductive particles and insulating particles, and an insulating adhesive layer, which does not include conductive particles, wherein the conductive particles and the insulating particles of the conductive adhesive layer may be present in a total particle area ratio of 80% or more of a total area of the anisotropic conductive film.

In some embodiments, the conductive particles and the insulating particles may be present in an amount of 25 wt % to 60 wt % based on a total weight of the conductive adhesive layer in terms of solid content.

In some embodiments, a volume ratio of the conductive particles to the insulating particles may range from 1.5:1 to 1:3.5.

In some embodiments, the conductive particles may have a particle diameter (d) from 1 μm to 10 μm, or from 1 μm to 5 μm.

In some embodiments, the conductive adhesive layer may have a thickness of 50% to 150% of the diameter of the conductive particles.

In some embodiments, a diameter ratio of the conductive particles to the insulating particles may range from 1.2:1 to 1:1.2.

In some embodiments, the insulating adhesive layer may be formed on one surface or both surfaces of the conductive adhesive layer.

In some embodiments, the conductive particles may include at least one type of particles selected from metal particles including at least one of Au, Ag, Ni, Cu, Pd, Al, Cr, Sn, Ti, and Pb; carbon particles; and resin particles or modified resin particles thereof coated with the metal particles. The resin particles may include at least one of benzoguanamine, polyethylene, polyester, polystyrene and polyvinyl alcohol.

In some embodiments, the conductive particles or the insulating particles may have protrusions formed on surfaces thereof.

In some embodiments, the insulating particles may be inorganic particles, organic particles, or a mixture of organic and inorganic particles, in which the inorganic particles may include at least one selected from among silica ($SiO_2$), $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, or $In_2O_3$; and the organic particles may include at least one resin selected from among acryl copolymers, benzoguanine, polyethylene, polyester, polystyrene, polyvinyl alcohol, polyurethane, and modified resins thereof.

In some embodiments, each of the conductive adhesive layer and the insulating adhesive layer may include a binder resin and a curing agent. In the conductive adhesive layer, the binder resin may be present in an amount of 10 wt % to 60 wt % and the curing agent may be present in an amount of 10 wt % to 40 wt % based on a total weight of the conductive adhesive layer in terms of solid content. In the insulating adhesive layer, the binder resin may be present in an amount of 30 wt % to 80 wt % and the curing agent may be present in an amount of 20 wt % to 70 wt % based on a total weight of the insulating adhesive layer in terms of solid content.

In some embodiments, a thickness ratio of the insulating adhesive layer to the conductive adhesive layer may be greater than 1/5 and less than 10.

In some embodiments, the conductive particles and the insulating particles of the conductive adhesive layer may be present in a total particle density of $7.0 \times 10^5/d^2$ to $10.0 \times 10^5/d^2$ (particles) per square millimeter ($mm^2$), the conductive adhesive layer may have a thickness of 50% to 150% of the diameter of the conductive particles, and centers of the conductive particles and the insulating particles may be placed on the substantially same plane.

Embodiments are also directed to a semiconductor device including: a) a wiring substrate; b) the conductive adhesive layer and the insulating adhesive layer of the anisotropic conductive film according to embodiments attached to the wiring substrate; and c) a semiconductor chip mounted on the conductive adhesive layer or the insulating adhesive layer.

In some embodiments, a volume ratio of the conductive particles to the insulating particles may range from 1.5:1 to 1:3.5 in the conductive adhesive layer.

In some embodiments, the conductive adhesive layer may have a thickness of 50% to 150% of the diameter of the conductive particles.

In some embodiments, a diameter ratio of the conductive particles to the insulating particles may range from 1.5:1 to 1:1.5.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "total particle density" of the conductive particles and the insulating particles of the conductive adhesive layer means density of all particles including the conductive particles and the insulating particles.

In an example embodiment, an anisotropic conductive film includes a conductive adhesive layer, which includes conductive particles and insulating particles, and an insulating adhesive layer, which does not include conductive particles. The conductive particles and the insulating particles of the conductive adhesive layer may have a total particle density of $7.0 \times 10^5/d^2$ to $10.0 \times 10^5/d^2$ (particles) per square millimeter (mm$^2$) (where d is a diameter of the conductive particles in μm). In an implementation, the total particle density may range from $7.0 \times 10^5/d^2$ to $10.0 \times 10^5/d^2$ (particles) per square millimeter (mm$^2$), e.g. $8.0 \times 10^5/d^2$ to $10.0 \times 10^5/d^2$ (particles) per square millimeter (mm$^2$), or $9.0 \times 10^5/d^2$ to $10.0 \times 10^5/d^2$ (particles) per square millimeter (mm$^2$) (where d is a diameter of the conductive particles in μm).

When the total particle density of the conductive particles and insulating particles ranges from $7.0 \times 10^5/d^2$ to $10.0 \times 10^5/d^2$ (particles) per square millimeter (mm$^2$), it may be possible to prevent deterioration in connection performance and insulation performance, which can occur when a space is formed in the conductive adhesive layer by the binder resin and the like in the adhesive layer to allow movement of the conductive particles in the space, or when the conductive particles are not arranged in a single layer within the adhesive layer and can move in the adhesive layer.

According to the present example embodiment, the anisotropic conductive film may minimize movement of the conductive particles upon thermal compression, which may increase the number of effective particles contributing to connection between terminals while preventing short circuit between adjacent terminals.

The conductive particles may have a diameter (d) from 1 μm to 10 μm, e.g., from 1 μm to 5 μm.

As used herein, the term "total particle area ratio" of the conductive particles and the insulating particles of the conductive adhesive layer means a total particle area ratio of the conductive particles and the insulating particles to the total area of the anisotropic conductive film in an x-y plane. The z-axis of the anisotropic conductive film corresponds to a direction in which the conductive particles or the insulating particles are compressed between a semiconductor chip and a wiring substrate, and thus, an area of the x-y plane is an area of a plane perpendicular to the direction of compression.

In an example embodiment, an anisotropic conductive film includes a conductive adhesive layer, which includes conductive particles and insulating particles, and an insulating adhesive layer, which does not include conductive particles. The conductive particles and the insulating particles of the conductive adhesive layer may be present in a total particle area ratio of 80% or more of a total area of the anisotropic conductive film. In an implementation, the total particle area ratio may be, e.g., 85% or more, 90% or more, or 95% or more.

Within this range of the total particle area ratio of the conductive particles and the insulating particles, it is possible to prevent deterioration in connection performance and insulation performance, which can occur when a space is formed in the conductive adhesive layer by the binder resin and the like in the adhesive layer to allow movement of the conductive particles in the space, or when the conductive particles are not arranged in a single layer within the adhesive layer and can move in the adhesive layer.

According to the present example embodiment, movement of the conductive particles may be minimized upon thermal compression, which may increase the number of effective conductive particles placed between terminals while preventing short circuit between adjacent terminals.

The conductive particles and the insulating particles may be present in an amount of 25 wt % to 60 wt % based on the total weight of the conductive adhesive layer in terms of solid content.

Figure 1:
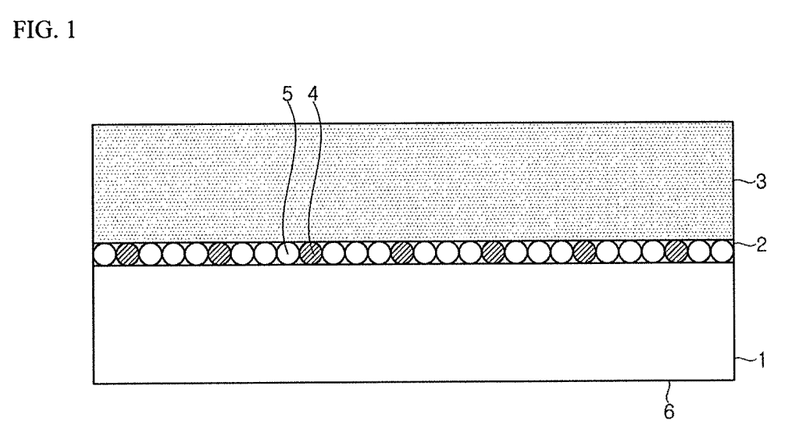
FIG. 1 illustrates a sectional view of an anisotropic conductive film according to an example embodiment.

FIG. 1 illustrates a sectional view of an anisotropic conductive film according to an example embodiment.

As shown in FIG. 1, an anisotropic conductive film 6 according to the present example embodiment includes an insulating adhesive layer 3 and a conductive adhesive layer 2. According to the present example embodiment, the anisotropic conductive film 6 may be on a base film 1. In the present example embodiment, conductive particles 4 and insulating particles 5 are arranged in a single layer without a clearance within the conductive adhesive layer 2, and thus may remain substantially stationary upon connection.

In addition, the conductive particles 4 and the insulating particles 5 may be very uniformly mixed to form the conductive adhesive layer 2, and the conductive particles 4 and the insulating particles 5 may provide a good distribution profile.

As described above, the conductive particles 4 and the insulating particles 5 may be arranged in a single layer without the clearance within the conductive adhesive layer 2. Thus, it may be possible to reduce deterioration in connection or insulation performance caused by movement of the conductive particles 4 within the conductive adhesive layer 2.

Figure 3:
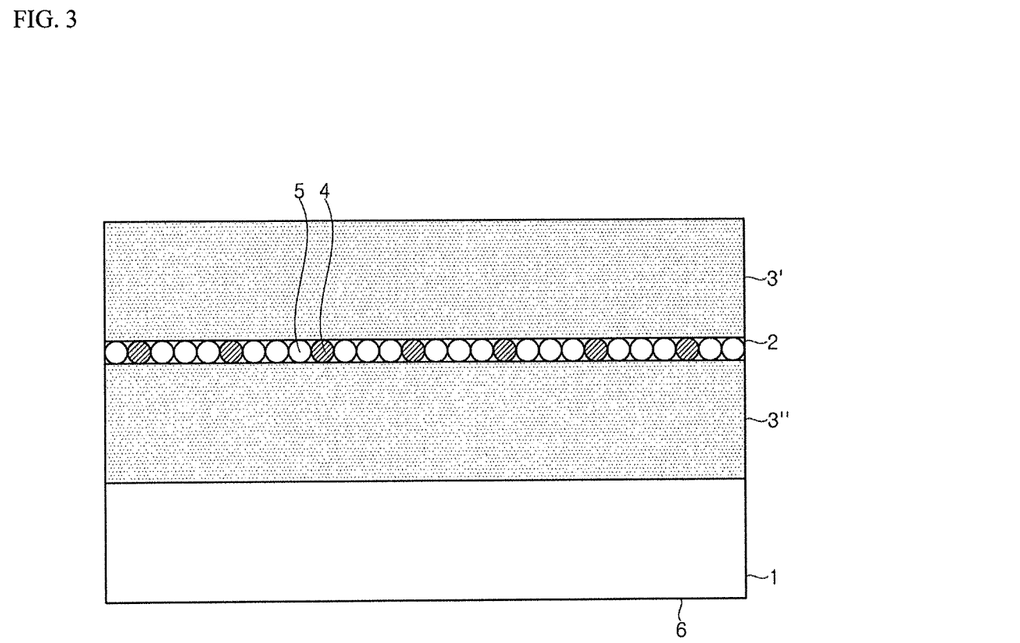
FIG. 3 illustrates a sectional view of an anisotropic conductive film according to another example embodiment.

FIG. 3 illustrates a sectional view of an anisotropic conductive film according to another example embodiment, in which insulating adhesive layers are formed on both surfaces of the conductive adhesive layer.

Referring to FIG. 3, the anisotropic conductive film according to the present embodiment may include a first insulating adhesive layer 3' and a second insulating adhesive layer 3" formed on both surfaces of a conductive adhesive layer 2, respectively.

Figure 2:
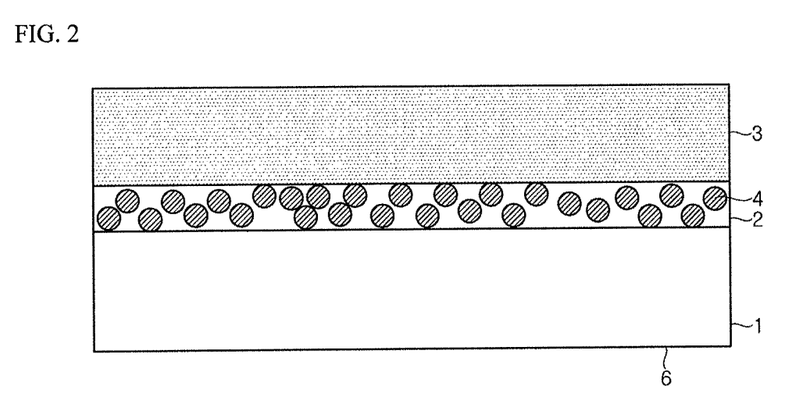
FIG. 2 illustrates a sectional view of a typical anisotropic conductive film including a conductive adhesive layer.

On the other hand, FIG. 2 illustrates a sectional view of a general anisotropic conductive film including a conductive adhesive layer. In this anisotropic conductive film, a conductive adhesive layer 2 provides a large clearance in which conductive particles 4 can move, such that the number of effective conductive particles on the terminal may be reduced upon compression, which may cause deterioration in connection and insulation performance.

According to example embodiments, the total particle density of the conductive particles and the insulating particles may be calculated, for example, by the following method.

First, an anisotropic conductive film is observed through an optical microscope. Here, an area of about 180 µm×130 µm (23,400 µm$^2$) is observed while adjusting magnification of the microscope. A total number of conductive particles and insulating particles in this area is calculated and divided by the measured area to calculate a particle density per µm$^2$. Finally, the total particle density (particles) per square millimeter (mm$^2$) is obtained from the result.

According to example embodiments, the total particle area ratio of the conductive particles and the insulating particles may be measured, for example, by the following method.

First, an anisotropic conductive film is observed through an optical microscope. Here, an area of about 180 µm×130 µm (23,400 µm$^2$) is observed while adjusting magnification of the microscope. Then, the area occupied by the conductive particles and the insulating particles relative to the total area is calculated using an image analysis program (Image Analyzer, IMT i-Solution, Product Name: i-Solution) to obtain the particle area ratio of the conductive particles and the insulating particles to the total area in percent (%).

The volume ratio of the conductive particles to the insulating particles may range from 1.5:1 to 1:3.5, e.g., from 1.2:1 to 1:3.2, or from 1:1 to 1:3. When the volume ratio is within the range of 1.5:1 to 1:3.5, it may be possible to achieve improvement in both insulation performance and connection performance.

The conductive adhesive layer may have a thickness of 50% to 150% of the diameter of the conductive particles. According to the present example embodiment, the conductive particles or the insulating particles have a diameter ranging from 1 µm to 10 µm, e.g., from 1 µm to 5 µm. Thus, the conductive adhesive layer may have a thickness ranging from 0.5 µm to 15 µm, e.g., from 0.5 µm to 7.5 µm. Within this range, movement of the conductive particles may be suppressed upon thermal compression, thereby improving insulation performance and connection performance.

The diameter ratio of the conductive particles to the insulating particles may range from 1.5:1 to 1:1.5. In an implementation, the conductive particles and the insulating particles may have substantially the same diameter.

In an example embodiment, an anisotropic conductive film includes a conductive adhesive layer, which includes conductive particles and insulating particles, and an insulating adhesive layer, which does not include conductive particles. The conductive particles and the insulating particles of the conductive adhesive layer have a total particle density of $7.0\times10^5/d^2$ to $10.0\times10^5/d^2$ (particles) per square millimeter (mm$^2$) (where d is a diameter of the conductive particles in µm), or wherein the conductive particles and the insulating particles of the conductive adhesive layer are present in a total particle area ratio of 80% or more of a total area of the anisotropic conductive film, the conductive adhesive layer has a thickness of 50% to 150% of the diameter of the conductive particles, and centers of the conductive particles and the insulating particles are placed substantially on the same plane. The expression "centers of the conductive particles and the insulating particles are placed substantially on the same plane" means that a substantially two-dimensional plane is formed when the centers of gravity of the conductive particles are connected to the centers of gravity of the insulating particles.

In another example embodiment, the conductive particles and the insulating particles of the conductive adhesive layer may have a total particle density of $10.0\times10^5/d^2$ (particles) per square millimeter (mm$^2$) and the centers of the conductive particles and the insulating particles may be placed substantially on the same plane.

The insulating adhesive layer may be formed on one surface or both surfaces of the conductive adhesive layer. In an implementation, the anisotropic conductive film includes insulating adhesive layers formed on both surfaces of the conductive adhesive layer.

The conductive particles may include, for example at least one type of particles selected from metal particles including at least one of Au, Ag, Ni, Cu, Pd, Al, Cr, Sn, Ti, and Pb; carbon particles; and resin particles or modified resin particles thereof coated with the metal particles. The resin particles may include at least one of benzoguanamine, polyethylene, polyester, polystyrene and polyvinyl alcohol.

The conductive particles or the insulating particles may have protrusions formed on surfaces thereof.

The insulating particles may be inorganic particles, organic particles, or a mixture of organic and inorganic particles, in which the inorganic particles may include at least one selected from among silica ($SiO_2$), $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, or $In_2O_3$; and the organic particles may include at least one resin selected from among acryl copolymers, benzoguanine, polyethylene, polyester, polystyrene, polyvinyl alcohol, polyurethane, and modified resins thereof. An example of the mixture of organic and inorganic particles may include silsesquioxane particles.

The thickness ratio of the insulating adhesive layer to the conductive adhesive layer may be greater than ⅕ and less than 10, e.g., greater than 2 and less than 8. Within this range, a space between adjacent circuits may be sufficiently filled with the insulating adhesive layer, which may provide good insulation and adhesion.

In the anisotropic conductive film according to the present example embodiment, each of the conductive adhesive layer and the insulating adhesive layer may further include a binder resin and a curing agent.

The binder resin may be selected from the group of acrylic, epoxy, urethane acrylate, phenoxy, acrylonitrile, styrene-acrylonitrile, butadiene, polyamide, olefin, urethane, and silicone resins. In an implementation, the binder resin is selected from the group of acrylic, epoxy, and urethane acrylate resins.

The acrylic resin may be a copolymer resin prepared through copolymerization of a (meth)acrylate monomer such as 1,6-hexanediol mono(meth)acrylate, 2-hydroxyethyl (meth)acrylate, 2-hydroxypropyl(meth)acrylate, 2-hydroxybutyl(meth)acrylate, 2-hydroxy-3-pentyloxypropyl(meth) acrylate, 1,4-butanediol(meth)acrylate, 2-hydroxyalkyl (meth)acryloyl phosphate, 4-hydroxycyclohexyl(meth) acrylate, neopentyl glycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth) acrylate, dipentaerythritol hexa(meth)acrylate, 2-(2-ethoxyethoxy)ethyl(meth)acrylate, stearyl(meth)acrylate, lauryl (meth)acrylate, 2-phenoxyethyl(meth)acrylate, isobornyl (meth)acrylate, tridecyl(meth)acrylate, ethoxylated nonylphenol(meth)acrylate, ethylene glycol di(meth)acrylate, diethylene glycol di(meth)acrylate, triethylene glycol di(meth)acrylate, t-ethylene glycol di(meth)acrylate, polyethyleneglycol di(meth)acrylate, 1,3-butylene glycol di(meth)acrylate, tripropylene glycol di(meth)acrylate, ethoxylated bisphenol-A di(meth)acrylate, cyclohexane dimethanol di(meth)acrylate, phenoxy-t-glycol(meth)acrylate, 2-methacryloyloxyethyl phosphate, dimethylol tricyclodecane di(meth)acrylate, trimethylolpropane benzoate acrylate, and fluorene(meth)acrylate, etc.

The epoxy resin may include a copolymer having at least one binding structure such as bisphenol type, novolac type, glycidyl type, and alicyclic groups, etc. For example, the epoxy resin may include bisphenol A or F or modified epoxy resins, phenol novolac epoxy resins, cresol novolac epoxy resins, epoxy resins having a dicyclopentadiene backbone, dimer acid modified epoxy resins, epoxy resins having a propylene glycol backbone, or urethane modified epoxy resins, and the like.

The urethane acrylate resin may include resins prepared from a diisocyanate, a polyol, a diol, or an acrylate monomer. The diisocyanate may include at least one selected from the group of tetramethylene-1,4-diisocyanate, hexamethylene-1,6-diisocyanate, cyclohexylene-1,4-diisocyanate, methylenebis(4-cyclohexyl isocyanate), isophorone diisocyanate, and 4-4 methylenebis(cyclohexyl diisocyanate). Examples of the polyol may include polyester polyol, polyether polyol, polycarbonate polyol, etc. The polyol may be obtained through condensation of a dicarboxylic acid compound and a diol compound. Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, isophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, tetrahydrophthalic acid, and the like. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, and the like. Examples of the diol may include 1,3-propanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, and the like. The acrylate may be, e.g., a hydroxy acrylate or amine acrylate.

The binder resin may be present in an amount of 10 wt % to 60 wt %, e.g., 15 wt % to 40 wt %, in the conductive adhesive layer. The binder resin may be present in an amount of 30 wt % to 80 wt %, e.g., 40 wt % to 70 wt %, in the insulating adhesive layer. Within these content ranges of the binder resin, the adhesive composition may be formed into a film. The binder resin may have a weight average molecular weight of, e.g., 30,000 g/mol to 1,000,000 g/mol, preferably 50,000 g/mol to 850,000 g/mol.

For the curing agent, a suitable curing agent may be used. Examples of the curing agent may include imidazole, benzoyl, acid anhydride, amine, hydrazide, cationic curing agents, latent curing agents, combinations thereof, etc.

The curing agent may be present in an amount of 10 wt % to 40 wt %, e.g., 15 wt % to 30 wt %, in the conductive adhesive layer. In addition, the curing agent may be present in an amount of 20 wt % to 70 wt %, e.g., 35 wt % to 50 wt %, in the insulating adhesive layer. Within this range, the curing agent may allow curing of the adhesive composition together with the binder resin when heated in a predetermined temperature range, such that the adhesive composition exhibits adhesive strength and has a firm structure, which may improve reliability.

In an example embodiment, a semiconductor device includes: a) a wiring substrate; b) the conductive adhesive layer and the insulating adhesive layer of the anisotropic conductive film according to embodiments attached to the wiring substrate; and c) a semiconductor chip mounted on the conductive adhesive layer or the insulating adhesive layer.

In the conductive adhesive layer, a volume ratio of the conductive particles to the insulating particles may range from 1.5:1 to 1:3.5.

The conductive adhesive layer may have a thickness of 50% to 150% of the diameter of the conductive particles.

A diameter ratio of the conductive particles to the insulating particles may range from 1.5:1 to 1:1.5

In an example embodiment, a method of manufacturing an anisotropic conductive film (including a conductive adhesive layer, which includes conductive particles and insulating particles, and an insulating adhesive layer, which does not include conductive particles) includes:

i) forming the conductive adhesive layer including the conductive particles and the insulating particles, wherein the conductive particles and the insulating particles of the conductive adhesive layer have a total particle density of $7.0 \times 10^5/d^2$ to $10.0 \times 10^5/d^2$ (particles) per square millimeter (mm$^2$) (where d is a diameter of the conductive particles in μm), or the conductive particles and the insulating particles of the conductive adhesive layer are present in a total particle area ratio of 80% or more of a total area of the anisotropic conductive film; and ii) forming the insulating adhesive layer not including the conductive particles on the conductive adhesive layer, or forming a separate insulating adhesive layer, followed by combining the conductive adhesive layer with the separate insulating adhesive layer to form the anisotropic conductive film including the conductive adhesive layer and the insulating adhesive layer.

The method according to the present example embodiment may further include uniformly mixing the conductive particles with the insulating particles in operation i).

The method according to the present example embodiment may further include confirming the total particle density of the conductive particles and the insulating particles in operation i). In addition, the method according to the present example embodiment may further include confirming the total particle area ratio of the conductive particles and the insulating particles in operation i). The particle density may be confirmed by observing the conductive adhesive layer through an optical microscope while adjusting magnification of the optical microscope. Here, an area of about 180 μm×130 μm (23,400 μm$^2$) is observed. A total number of conductive particles and insulating particles in this area is calculated and divided by the measured area to calculate a particle density per μm$^2$. Finally, the total particle density (particles) per square millimeter (mm$^2$) is obtained from the result. The total particle area ratio of the conductive particles and the insulating particles may be measured by observing the anisotropic conductive film through an optical microscope while adjusting magnification of the optical microscope. Here, an area of about 180 μm×130 μm (23,400 μm$^2$) is observed. Then, the area occupied by the conductive particles and the insulating particles relative to the total area is calculated using an image analysis program (Image Analyzer, IMT i-Solution, Product Name: i-Solution) to obtain the particle area ratio of the conductive particles and the insulating particles to the total area in percent (%).

In the conductive adhesive film in operation i), the volume ratio of the conductive particles to the insulating particles may range from 1.5:1 to 1:3.5, e.g., from 1.2:1 to 1:3.2, or from 1:1 to 1:3. When the volume ratio is within the range of 1.5:1 to 1:3.5, it may be possible to achieve improvement in both insulation performance and connection performance.

The conductive adhesive layer may have a thickness of 50% to 150% of the diameter of the conductive particles. Within this range, movement of the conductive particles may be suppressed upon thermal compression, which may improve insulation performance and connection performance.

The diameter ratio of the conductive particles to the insulating particles may range from 1.5:1 to 1:1.5. In an implementation, the conductive particles and the insulating particles have substantially the same diameter.

The method according to the present example embodiment may further include forming a second insulating adhesive layer on the other surface of the conductive adhesive layer after operation ii).

Each of the conductive adhesive layer and the insulating adhesive layer of anisotropic conductive film may further include at least one additive selected from the group of solvents, polymerization inhibitors, anti-oxidants, heat stabilizers, and curing accelerators. The additives may be present in an amount of 1 wt % to 5 wt % in each of the adhesive layers.

As for the solvent, a suitable solvent, for example, toluene or methylethylketone, may be used. The polymerization inhibitor may be, e.g., hydroquinone, hydroquinone monomethylether, p-benzoquinone, phenothiazine, mixtures thereof, etc. The anti-oxidant may be included to prevent oxidation of the composition due to heat or to provide thermal stabilization, and may be, e.g., branched phenolic or hydroxy cinnamate materials, etc. The curing accelerator may include at least one of solid imidazole curing accelerators, solid and liquid amine curing accelerators, etc.

A general apparatus or equipment may be used to form the anisotropic conductive film according to the present example embodiment. For example, the anisotropic conductive film may be prepared by stirring and mixing the conductive particles and the insulating particles in the solvent to prepare a uniform dispersion, and then adding a binder resin and a curing agent to the mixture, or by stirring the conductive particles, the insulating particles, the binder resin and the curing agent for a certain period of time at a rate that does not cause pulverization of the conductive particles or the insulating particles, applying the mixture to a release film to a thickness of 0.5 µm to 15 µm, followed by drying the mixture for a sufficient period of time to evaporate the solvent.

In another implementation, an insulating adhesive film may be formed by stirring the binder resin, the curing agent, and the solvent for a predetermined period of time, coating the mixture onto a release film to a thickness of 0.5 µm to 80 µm, followed by drying the mixture for a sufficient period of time to evaporate the solvent. Then, the conductive adhesive film may be combined with the insulating adhesive film to form an anisotropic conductive film having a double or more layer structure.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

1. Preparation of Anisotropic Conductive Film of Examples 1 to 6

Example 1

An insulating adhesive layer was prepared using 35 wt % of a phenoxy resin (Kukdo Chemical Co., Ltd.), 20 wt % of an epoxy resin EP-630 (JER Co., Ltd.), and 45 wt % of a latent curing agent HP3941HP (Asahi Kasei, K.K.) in terms of solid content, and a conductive adhesive layer was prepared using 20 wt % of the phenoxy resin, 4 wt % of the epoxy resin EP-630, 23 wt % of the latent curing agent HP3841HP, 38 wt % of nickel-plated conductive particles having a particle diameter of 3 µm, and 15 wt % of insulating particles formed of an acryl copolymer resin and having a particle diameter of 3 µm in terms of solid content. Here, each of the compositions was prepared by dissolving and dispersing the components in a solvent and coating the composition onto a PET release film, followed by evaporating the solvent, thereby preparing a 12 µm thick insulating adhesive layer or a 1.5 µm thick conductive adhesive layer. Then, the insulating adhesive layer and the conductive adhesive layer were combined to form an anisotropic conductive film of Example 1.

Example 2

An anisotropic conductive film of Example 2 was prepared in the same manner as in Example 1 except that the conductive adhesive layer had a thickness of 4.5 µm.

Example 3

An anisotropic conductive film of Example 3 was prepared in the same manner as in Example 1 except that a conductive adhesive layer was prepared using 26 wt % of the phenoxy resin, 4 wt % of the epoxy resin EP-630, 29 wt % of the latent curing agent HP3841HP, 19 wt % of the nickel-plated conductive particles having a particle diameter of 3 µm, and 22 wt % of the insulating particles formed of an acryl copolymer resin and having a particle diameter of 3 µm in terms of solid content. Here, the composition was prepared by dissolving and dispersing the components in a solvent and coating the composition onto a PET release film, followed by evaporating the solvent, thereby preparing a 3 µm conductive adhesive layer, which was combined with the insulating adhesive layer to form the anisotropic conductive film.

Example 4

An anisotropic conductive film of Example 4 was prepared in the same manner as in Example 1 except that a conductive adhesive layer was prepared using 32 wt % of the phenoxy resin, 4 wt % of the epoxy resin EP-630, 36 wt % of the latent curing agent HP3841HP, 13 wt % of the nickel-plated conductive particles having a particle diameter of 3 and 15 wt % of the insulating particles formed of an acryl copolymer resin and having a particle diameter of 3 µm in terms of solid content. Here, the composition was prepared by dissolving and dispersing the components in a solvent and coating the composition onto a PET release film, followed by evaporating the solvent, thereby preparing a 3 μm conductive adhesive layer, which was combined with the insulating adhesive layer to form the anisotropic conductive film.

Example 5

An anisotropic conductive film of Example 5 was prepared in the same manner as in Example 1 except that a conductive adhesive layer was prepared using 23 wt % of the phenoxy resin, 3 wt % of the epoxy resin EP-630, 25 wt % of the latent curing agent HP3841HP, 34 wt % of the nickel-plated conductive particles having a particle diameter of 4 μm, and 15 wt % of the insulating particles formed of an acryl copolymer resin and having a particle diameter of 4 μm in terms of solid content. Here, the composition was prepared by dissolving and dispersing the components in a solvent and coating the composition onto a PET release film, followed by evaporating the solvent, thereby preparing a 4 μm conductive adhesive layer, which was combined with the insulating adhesive layer to form the anisotropic conductive film.

Example 6

An anisotropic conductive film of Example 6 was prepared in the same manner as in Example 1 except that a conductive adhesive layer was prepared using 21 wt % of the phenoxy resin, 2 wt % of the epoxy resin EP-630, 23 wt % of the latent curing agent HP3841HP, 39 wt % of the nickel-plated conductive particles having a particle diameter of 3 μm, and 15 wt % of the insulating particles formed of an acryl copolymer resin and having a particle diameter of 2.5 μm in terms of solid content. Here, the composition was prepared by dissolving and dispersing the components in a solvent, and coating the composition onto a PET release film, followed by evaporating the solvent, thereby preparing a 3 μm conductive adhesive layer, which was combined with the insulating adhesive layer to form the anisotropic conductive film.

2. Preparation of Anisotropic Conductive Film of Comparative Examples 1 and 2

Comparative Example 1

An anisotropic conductive film of Comparative Example 1 was prepared in the same manner as in Example 1 except that a conductive adhesive layer was prepared using 17 wt % of the phenoxy resin, 3 wt % of the epoxy resin EP-630, 14 wt % of the latent curing agent HP3841HP, 51 wt % of the nickel-plated conductive particles having a particle diameter of 3 μm, and 15 wt % of the insulating particles formed of an acryl copolymer resin and having a particle diameter of 3 μm in terms of solid content. Here, the composition was prepared by dissolving and dispersing the components in a solvent and coating the composition onto a PET release film, followed by evaporating the solvent, thereby preparing a 3 μm conductive adhesive layer, which was combined with the insulating adhesive layer to form the anisotropic conductive film.

Comparative Example 2

An anisotropic conductive film of Comparative Example 2 was prepared in the same manner as in Example 1 except that a conductive adhesive layer was prepared using 35 wt % of the phenoxy resin, 5 wt % of the epoxy resin EP-630, 39 wt % of the latent curing agent HP3841HP, 10 wt % of the nickel-plated conductive particles having a particle diameter of 3 vim, and 11 wt % of the insulating particles formed of an acryl copolymer resin and having a particle diameter of 3 μm in terms of solid content. Here, the composition was prepared by dissolving and dispersing the components in a solvent and coating the composition onto a PET release film, followed by evaporating the solvent, thereby preparing a 3 μm conductive adhesive layer, which was combined with the insulating adhesive layer to form the anisotropic conductive film.

3. Property Evaluation of Anisotropic Conductive Film

The anisotropic conductive films prepared in Examples 1 to 6 and Comparative Examples 1 and 2 were evaluated as to the volume ratio of the conductive particles to the insulating particles, the total particle density of the conductive particles and the insulating particles, connection resistance, and insulation resistance by the following methods. Results are shown in Tables 1 and 2.

1) Volume Ratio of Conductive Particles to Insulating Particles

Each of the anisotropic conductive films prepared in Examples 1 to 6 and Comparative Examples 1 and 2 was observed through an optical microscope BX51 (OLYMPUS). An area of about 180 μm×130 μm (23,400 μm$^2$) of the conductive film was observed while adjusting magnification of the microscope. A total number of conductive particles and insulating particles was calculated to calculate the volume ratio.

2) Total Particle Density of Conductive Particles and Insulating Particles

Each of the anisotropic conductive films prepared in Examples 1 to 6 and Comparative Examples 1 and 2 was observed through an optical microscope BX51 (OLYMPUS). An area of about 180 μm×130 μm (23,400 μm$^2$) of the conductive film was observed while adjusting magnification of the microscope. A total number of conductive particles and insulating particles in this area was calculated and divided by the measured area to calculate a particle density per μm$^2$. Finally, the total particle density (particles) per square millimeter (mm$^2$) was obtained from the result.

3) Total Particle Area Ratio of Conductive Particles and Insulating Particles

Each of the anisotropic conductive films prepared in Examples 1 to 6 and Comparative Examples 1 and 2 was observed through an optical microscope BX51 (OLYMPUS). An area of about 180 μm×130 μm (23,400 μm$^2$) of the conductive film was observed while adjusting magnification of the microscope. Then, the area occupied by the conductive particles and the insulating particles relative to the total area was calculated using an image analysis program (Image Analyzer, IMT i-Solution, Product Name: i-Solution) to obtain the particle area ratio of the conductive particles and the insulating particles to the total area in percent (%).

4) Connection Resistance

Each of the anisotropic conductive films was cut into a size of 2 mm×25 mm and bonded to a substrate for evaluation of connection resistance. Here, the anisotropic conductive film was placed on a 0.5 mm thick glass substrate by preliminary compression under conditions of 60° C. and 1 MPa for 1 sec, followed by removing a PET film from the anisotropic conductive film. Then, a chip (chip length: 19.5 mm, chip width: 1.5 mm, bump length: 100 μm, bump width: 12 μm) was aligned on the film, followed by primary compression under conditions of 200° C. and 90 MPa for 1 sec. Connection resistance of the anisotropic conductive film was measured using a resistance tester by a 4-point probe method, by which resistance between 4 points is measured using 4 probes connected to the resistance tester. Connection resistance was calculated based on voltage measured upon application of 1 mA to the resistance tester.

5) Insulation Resistance

Each of the anisotropic conductive films was cut into a size of 2 mm×25 mm and bonded to a substrate for evaluation of insulation resistance. Here, the anisotropic conductive film was placed on a 0.5 mm thick glass substrate by preliminary compression under conditions of 60° C. and 1 MPa for 1 sec, followed by removing a PET film from the anisotropic conductive film. Then, a chip (chip length: 19.5 mm, chip width: 1.5 mm, bump pitch: 8 μm) was aligned on the film, followed by primary compression under conditions of 200° C. and 90 MPa for 1 sec. Occurrence of short circuit was checked at a total of 38 points by a 2-point probe method by applying a voltage of 50 V thereto.

TABLE 1

|  | Example 1 | Example 2 | Example 3 | Example 4 | Example 5 | Example 6 |
|---|---|---|---|---|---|---|
| Content of conductive particles and insulating particles | 53% | 53% | 41% | 28% | 49% | 54% |
| Particle ratio (volume ratio) | 1:1 | 1:1 | 1:3 | 1:3 | 1:1 | 1:1 |
| Thickness of conductive adhesive layer (μm) | 1.5 | 4.5 | 3 | 3 | 4 | 3 |
| Particle diameter of conductive particles (μm) | 3 | 3 | 3 | 3 | 4 | 3 |
| Particle diameter of insulating particles (μm) | 3 | 3 | 3 | 3 | 4 | 2.5 |
| Particle density (per mm$^2$) | 99,000 particles | 92,000 particles | 105,000 particles | 78,000 particles | 88,000 particles | 102,000 particles |
| Area ratio (%) | 90 | 86 | 92 | 80 | 90 | 90 |
| Connection resistance (Ω) | 0.04 | 0.05 | 0.07 | 0.09 | 0.04 | 0.04 |
| Insulation resistance (Ω) | $1.0 \times 10^9$ | $1.0 \times 10^9$ | $1.0 \times 10^9$ | $1.0 \times 10^9$ | $1.0 \times 10^9$ | $1.0 \times 10^9$ |

TABLE 2

|  | Comparative Example 1 | Comparative Example 2 |
|---|---|---|
| Content of conductive particles and insulating particles | 66% | 21% |
| Particle ratio (volume ratio) | 2:1 | 1:3 |
| Thickness of conductive adhesive layer (μm) | 3 | 3 |
| Particle diameter of conductive particles (μm) | 3 | 3 |
| Particle diameter of insulating particles (μm) | 3 | 3 |
| Particle density (per mm$^2$) | 120,000 particles | 55,000 particles |
| Area ratio (%) | 95 | 58 |
| Connection resistance (Ω) | 1.25 | 0.50 |
| Insulation resistance (Ω) | Short circuit | $1.0 \times 10^9$ |

As shown in Tables 1 and 2, when the total particle density of the conductive particles and the insulating particles in the conductive adhesive layer was in the range from $7.0 \times 10^5/d^2$ to $10.0 \times 10^5/d^2$ (particles) per square millimeter (mm$^2$), the anisotropic conductive films had good properties in terms of both connection resistance and insulation resistance. On the other hand, without being bound by theory, it is believed that, in the anisotropic adhesive film of Comparative Example 1, in which the total particle density thereof exceeded $10.0 \times 10^5/d^2$ (particles) per square millimeter, the particles were not arranged in a single layer to allow movement of the particles, causing increase in connection resistance, and in Comparative Example 2, in which the total particle density thereof was less than $7.0 \times 10^5/d^2$ (particles) per square millimeter, the anisotropic adhesive film had a large movement space of the particles, causing increase in connection resistance.

In addition, in Examples 1 to 6, in which the volume ratio of the conductive particles to the insulating particles in the conductive adhesive layer was in the range of 1:1 to 1:3, the anisotropic adhesive films had good properties in terms of both connection resistance and insulation resistance. On the other hand, without being bound by theory, it is believed that, in Comparative Example 1, in which the volume ratio was 2:1, short circuit occurred due to insufficient insulation by an excess of conductive particles.

By way of summation and review, an anisotropic conductive film may have conductive particles such as metal particles (including, e.g., nickel or gold particles) or metal-coated polymer particles dispersed in a resin. When such an anisotropic conductive film placed between circuit members is subjected to heating and compression under predetermined conditions, circuit terminals are electrically connected to each other through electrically conductive particles, and a space between adjacent circuits is filled with an insulating adhesive resin to allow the conductive particles to be independent of each other, thereby providing high insulation properties.

Anisotropic conductive films are generally used for electrical connection between a liquid crystal display (LCD) panel and a tape carrier package (TCP) or between a circuit printed board and TCP, and the like. In a circuit connection process, the anisotropic conductive film is disposed between two circuit members and is compressed by application of heat and pressure thereto. Without being bound by theory, it is believed that conductive particles move between the two circuit members, thereby causing less capture of the conductive particles between corresponding terminals and increase in the number of conductive particles between adjacent terminals. As a result, the anisotropic conductive film may suffer from deterioration in electrical connection and insulating performance between adjacent terminals.

According to a recent trend of large size and reduced thickness in the field of displays, electrodes and a circuit pitch have been gradually miniaturized. Particularly, to satisfy high resolution of mobile devices, areas of terminals to be connected and an inter-terminal distance are gradually decreasing. Thus, it is desirable that the anisotropic conductive film provide optimum performance in terms of connection and insulation. However, a typical anisotropic conductive film of a single-layer or multilayer structure has a limitation in connection of fine circuit terminals (for example, Korean Patent Application No. 2010-0140773 and No. 2010-0138216).

As a method for securing connection and insulation performance of the anisotropic conductive film in connection of fine circuit terminals, it can be proposed to prepare the anisotropic conductive film by reducing the size of conductive particles while increasing density of the conductive particles. In this case, however, it may difficult to reduce occurrence of short circuit due to a narrowed gap between the circuit terminals, and the reduced size of the conductive particles may provide a small connection point and low capability in coping with height deviation of elements, which may lead to deteriorated connection performance.

As described above, embodiments may provide an anisotropic conductive film, which includes a conductive adhesive layer including conductive particles and insulating particles, and an insulating adhesive layer not including conductive particles, wherein the conductive particles and the insulating particles of the conductive adhesive layer have a total particle density of $7.0\times10^5/d^2$ to $10.0\times10^5/d^2$ (particles) per square millimeter ($mm^2$) (where d is a diameter of the conductive particles in μm), and a method of manufacturing the same. Embodiments may provide an anisotropic conductive film capable of securing connection and insulation reliability when connecting fine circuits having small terminal areas and small inter-terminal distances (as in high resolution mobile devices and the like), and a semiconductor device connected by the anisotropic conductive film. The anisotropic conductive film according to an embodiment may be capable of securing excellent electrical connection and stable insulation between adjacent terminals in connection of fine circuits.

In an anisotropic conductive film according to an embodiment, the conductive particles and the insulating particles are uniformly mixed such that the particles are present in one separate layer to be adjacent each other so as to minimize movement of the particles upon thermal compression, which may increase the number of effective particles contributing to connection between terminals while preventing short circuit between adjacent terminals.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An anisotropic conductive film, comprising:
   a conductive adhesive layer, which includes conductive particles and insulating particles, and an insulating adhesive layer, which does not include conductive particles,
   wherein the conductive particles and the insulating particles of the conductive adhesive layer have a total particle density of $7.0\times10^5/d^2$ to $10.0\times10^5/d^2$ (particles) per square millimeter ($mm^2$) (where d is a diameter of the conductive particles in μm), and
   wherein a volume ratio of the conductive particles to the insulating particles ranges from 1.5:1 to 1:1.5.

2. The anisotropic conductive film as claimed in claim 1, wherein the conductive particles and the insulating particles are present in an amount of 25 wt % to 60 wt % based on a total weight of the conductive adhesive layer in term of solid content.

3. The anisotropic conductive film as claimed in claim 1, wherein the conductive particles have a particle diameter (d) of 1 μm to 10 μm.

4. The anisotropic conductive film as claimed in claim 1, wherein the conductive adhesive layer has a thickness of 50% to 150% of the diameter (d) of the conductive particles.

5. The anisotropic conductive film as claimed claim 1, wherein the insulating adhesive layer is formed on one or both surfaces of the conductive adhesive layer.

6. An anisotropic conductive film, comprising:
   a conductive adhesive layer, which includes conductive particles and insulating particles, and an insulating adhesive layer, which does not include conductive particles,
   wherein the conductive particles and the insulating particles of the conductive adhesive layer are present in a total particle area ratio of 80% or more of a total area of the anisotropic conductive film, and
   wherein the conductive adhesive layer has a thickness of 50% to 150% of the diameter of the conductive particles.

7. The anisotropic conductive film as claimed in claim 6, wherein the conductive particles and the insulating particles are present in an amount of 25 wt % to 60 wt % based on a total weight of the conductive adhesive layer in term of solid content.

8. The anisotropic conductive film as claimed in claim 6, wherein a volume ratio of the conductive particles to the insulating particles ranges from 1.5:1 to 1:3.5.

9. The anisotropic conductive film as claimed in claim 1, wherein the conductive adhesive layer or the insulating adhesive layer comprises a binder resin and a curing agent.

10. The anisotropic conductive film as claimed in claim 9, wherein the binder resin is present in an amount of 10 wt % to 60 wt % and the curing agent is present in an amount of 10 wt % to 40 wt %, based on a total weight of the conductive adhesive layer in terms of solid content.

11. The anisotropic conductive film as claimed in claim 9, wherein the binder resin is present in an amount of 30 wt % to 80 wt % and the curing agent is present in an amount of 20 wt % to 70 wt %, based on a total weight of the insulating adhesive layer in terms of solid content.

12. The anisotropic conductive film as claimed in claim 1, wherein a thickness ratio of the insulating adhesive layer to the conductive adhesive layer is greater than 1/5 and less than 10.

13. An anisotropic conductive film, comprising:
a conductive adhesive layer, which includes conductive particles and insulating particles, and an insulating adhesive layer, which does not include conductive particles,
wherein the conductive particles and the insulating particles of the conductive adhesive layer have a total particle density of $7.0\times10^5/d^2$ to $10.0\times10^5/d^2$ (particles) per square millimeter ($mm^2$) (where d is a diameter of the conductive particles in μm), the conductive adhesive layer has a thickness of 50% to 150% of the diameter of the conductive particles, and centers of the conductive particles and the insulating particles are placed substantially on the same plane.

14. A display device, comprising:
a) a wiring substrate;
b) the conductive adhesive layer and the insulating adhesive layer of the anisotropic conductive film as claimed in claim 1, the anisotropic conductive film being attached to the wiring substrate; and
c) a semiconductor chip mounted on the conductive adhesive layer or the insulating adhesive layer.

15. The anisotropic conductive film as claimed in claim 5, wherein a thickness ratio of the insulating adhesive layer to the conductive adhesive layer is greater than 1/5 and less than 10.

16. The anisotropic conductive film as claimed in claim 6, wherein a thickness ratio of the insulating adhesive layer to the conductive adhesive layer is greater than 1/5 and less than 10.

17. A display device, comprising:
a) a wiring substrate;
b) the conductive adhesive layer and the insulating adhesive layer of the anisotropic conductive film as claimed in claim 8, the anisotropic conductive film being attached to the wiring substrate; and
c) a semiconductor chip mounted on the conductive adhesive layer or the insulating adhesive layer.

* * * * *